US010538090B2

(12) United States Patent
Yaginuma et al.

(10) Patent No.: US 10,538,090 B2
(45) Date of Patent: Jan. 21, 2020

(54) METHOD FOR MANUFACTURING PERFORATED SUBSTRATE, METHOD FOR MANUFACTURING LIQUID EJECTION HEAD, AND METHOD FOR DETECTING FLAW

(71) Applicant: CANON KABUSHIKI KAISHA, Tokyo (JP)

(72) Inventors: Seiichiro Yaginuma, Kawasaki (JP); Masataka Nagai, Yokohama (JP); Masaya Uyama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 60 days.

(21) Appl. No.: 15/817,016

(22) Filed: Nov. 17, 2017

(65) Prior Publication Data

US 2018/0147849 A1 May 31, 2018

(30) Foreign Application Priority Data

Nov. 25, 2016 (JP) ................................ 2016-229323

(51) Int. Cl.
*H01L 21/308* (2006.01)
*H01L 21/3065* (2006.01)
*B41J 2/16* (2006.01)

(52) U.S. Cl.
CPC ............... *B41J 2/1629* (2013.01); *B41J 2/16* (2013.01); *B41J 2/1631* (2013.01)

(58) Field of Classification Search
CPC . H01L 21/467; H01L 21/47573; B41J 2/1629
See application file for complete search history.

(56) References Cited

U.S. PATENT DOCUMENTS 6,846,424 B2 * 1/2005 Baum .................. C07F 15/004 216/13
2011/0018938 A1 1/2011 Rivas
2011/0249063 A1 * 10/2011 Nakakubo ................ B41J 2/085 347/54

* cited by examiner

*Primary Examiner* — Thomas T Pham
(74) *Attorney, Agent, or Firm* — Canon U.S.A. Inc., IP Division

(57) ABSTRACT

A method for manufacturing a perforated substrate includes forming a through-hole extending through a substrate from a first surface to a second surface opposite the first surface; forming a film on the first surface, a sidewall of the through-hole, and the second surface; forming a resist on the first surface; patterning the resist such that the resist closes an opening of the through-hole in the first surface; etching the film on the first surface using the resist as a mask; before the etching step, forming an inspection member on the second surface such that the inspection member closes an opening of the through-hole in the second surface; and determining whether there is a film patterning defect or a flaw that causes a film patterning defect.

16 Claims, 4 Drawing Sheets

METHOD FOR MANUFACTURING PERFORATED SUBSTRATE, METHOD FOR MANUFACTURING LIQUID EJECTION HEAD, AND METHOD FOR DETECTING FLAW

BACKGROUND OF THE INVENTION

Field of the Invention

The present disclosure relates to methods for manufacturing perforated substrates, methods for manufacturing liquid ejection heads, and methods for detecting flaws.

Description of the Related Art

Liquid ejection heads are used in liquid ejection apparatuses such as inkjet recording apparatuses. Some liquid ejection heads have films formed thereon to protect drive circuits and substrates from liquid. US 2011-0018938 A1 discloses that such a film is formed over an entire liquid ejection head.

SUMMARY OF THE INVENTION

The present disclosure provides a method for manufacturing a perforated substrate in which a film patterning defect or a flaw that causes a film patterning defect can be easily detected.

An aspect of the present disclosure provides a method for manufacturing a perforated substrate. The method includes forming at least one through-hole extending through a substrate from a first surface to a second surface opposite the first surface; forming a film on the first surface, a sidewall of the at least one through-hole, and the second surface; forming a resist on the first surface; patterning the resist such that the resist closes an opening of the at least one through-hole in the first surface; etching the film on the first surface using the resist as a mask; before the etching step, forming an inspection member on the second surface such that the inspection member closes an opening of the at least one through-hole in the second surface; and at least one of the steps of a) after the etching, determining whether there is a film patterning defect from a color change in the inspection member; and b) determining whether there is a flaw that causes a film patterning defect from a height difference that appears on the inspection member at a pressure different from a pressure at which the openings of the at least one through-hole in the first and second surfaces are closed, wherein the inspection member is a deformable member.

Further features of the present disclosure will become apparent from the following description of exemplary embodiments with reference to the attached drawings.

DESCRIPTION OF THE EMBODIMENTS

There are cases where a film is partially removed from one surface (front surface) of a substrate having a through-hole by etching using a resist as a mask. If there is a flaw in the resist during etching, the film on the sidewall of the through-hole and the other surface (back surface) may be incidentally etched. Such film patterning defects may be difficult to detect. In particular, such defects are difficult to detect on the sidewall of the through-hole in a nondestructive manner. Defect detection may also be difficult on the front and back surfaces of the substrate, depending on the type and surface profile of the film formed later. This phenomenon can occur not only for liquid ejection heads, but also for perforated substrates (substrates having through-holes) having film patterns as described above.

As used herein, the surface of a substrate on which a film as described above is to be etched may be referred to as “front surface”, whereas the backside surface opposite the front surface (i.e., the surface of the substrate on which an inspection member according to an example embodiment, as described later, is to be provided) may be referred to as “back surface”.

Figure 1:
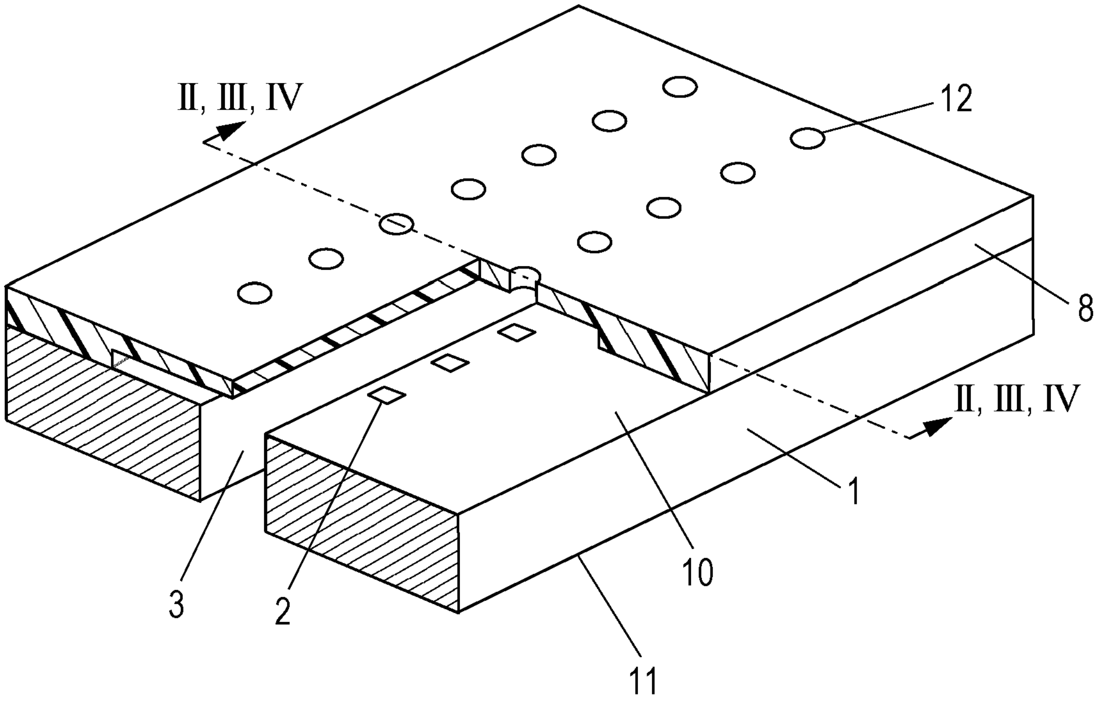
FIG. 1 illustrates an example liquid ejection head.

Film patterning defects will now be described with reference to the drawings. FIGS. 2A to 2D illustrate an example method for manufacturing a liquid ejection head in the related art, showing cross-sections corresponding to a cross-section taken along line II-II of a liquid ejection head shown in FIG. 1, described later. Whereas FIG. 1 shows one chip, FIGS. 2A to 4G show liquid ejection heads before cutting into a plurality of chips.

Figure 2A:
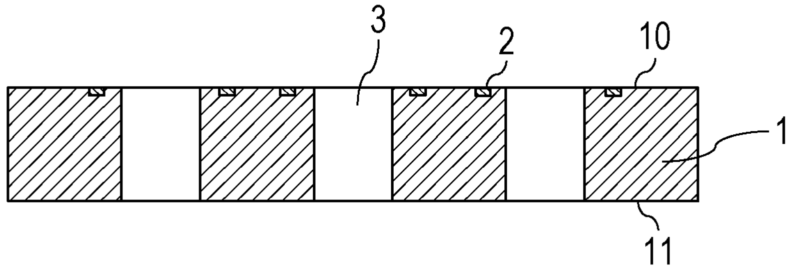
FIGS. 2A to 2D illustrate an example method for manufacturing a liquid ejection head in the related art.
Figure 2B:
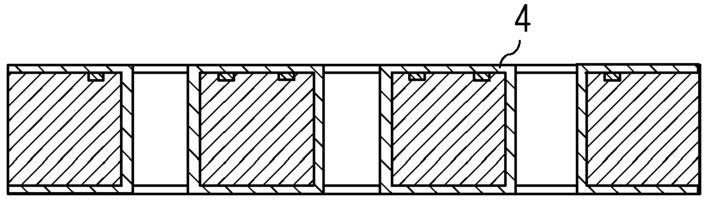
Figure 2C:
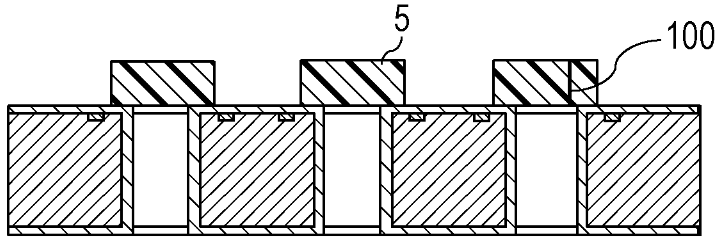

As shown in FIG. 2A, energy-generating devices 2 are formed on a substrate 1 having a front surface 10 and a back surface 11, and through-holes 3 are formed in the substrate 1. The through-holes 3 serve as supply holes through which a liquid is supplied from the back surface 11 of the substrate 1 to liquid channels (formed between the front surface 10 of the substrate 1 and a channel-forming member 8 shown in FIG. 1). As shown in FIG. 2B, a functional film 4 is then formed. As shown in FIG. 2C, a resist 5 is then patterned such that the resist 5 closes the through-holes 3. If there is a flaw 100 in the resist 5, the functional film 4 may be incidentally etched by an etchant or etching gas entering through the flaw 100 during the etching of the functional film 4. This may result in a functional film patterning defect.

Figure 2D:
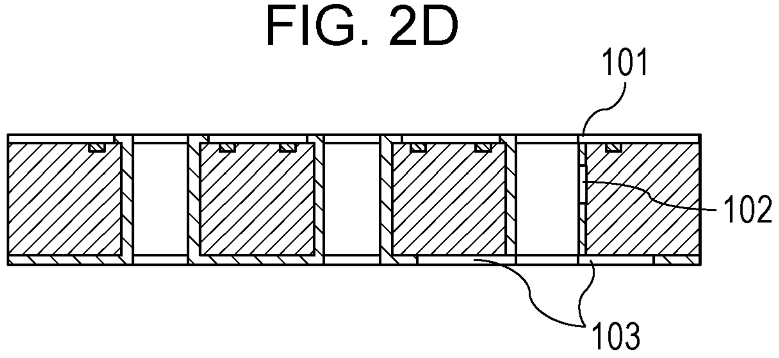

As shown in FIG. 2D, functional film patterning defects occur as all or any of a substrate front surface patterning defect 101, a through-hole sidewall patterning defect 102, and substrate back surface patterning defects 103. These defects 101, 102, and 103 may be difficult to detect. In particular, the through-hole sidewall patterning defect 102 is difficult to detect in a nondestructive manner. The front surface patterning defect 101 and the back surface patterning defects 103 may also be difficult to detect, depending on the type and surface profile of the film formed later.

Example embodiments of the present disclosure will now be described with reference to the drawings. In the description below, a liquid ejection head is mainly described as an example of a perforated substrate, and a functional film is mainly described as an example of a film. The disclosure, however, is not limited to the materials, structures, and methods of manufacture illustrated below.

FIG. 1 illustrates an example liquid ejection head. A substrate 1 has a front surface 10 and a back surface 11. Energy-generating devices 2 are disposed on the front surface 10. A channel-forming member 8 is disposed on the front surface 10 such that the channel-forming member 8 forms liquid channels with the substrate 1. The channel-forming member 8 has orifices 12 for liquid ejection. The substrate 1 has a through-hole 3. The through-hole 3 communicates with the liquid channels. A liquid to be ejected is supplied from the back surface 11 of the substrate 1 to the through-hole 3 and is ejected from the orifices 12 through the liquid channels. Thus, the through-hole 3 serves as a supply hole through which a liquid is supplied from the back surface 11 of the substrate 1 to the liquid channels.

According to one example embodiment, through-holes are formed in a liquid ejection head substrate. The through-holes extend through the substrate from a first surface to a second surface opposite the first surface. A functional film is formed on the first and second surfaces and on the sidewalls of the through-holes. The first surface is the surface of the substrate on which the functional film is to be etched (front surface). The second surface is the surface opposite the first surface, that is, the surface of the substrate on which an inspection member, described in detail later, is to be provided (back surface).

After the functional film is formed, a resist is formed on the first surface (front surface) of the substrate. The resist is then patterned such that the resist closes the through-holes. Thus, the resist is formed such that the resist closes the through-holes at the stage of resist formation.

According to this example embodiment, before the etching of the resist, an inspection member is formed on the second surface (back surface) of the substrate such that the inspection member closes the openings of the through-holes in the back surface. As described in detail later, a functional film patterning defect or a flaw that causes a functional film patterning defect is detected from a change that appears on the inspection member. As used herein, the inspection member may be referred to as "inspection monitor".

Examples of functional films include protective films, antireflection films, light-absorbing films, light reflective films, through-hole-diameter control film, planarizing films, friction control films, water-repellent films, oil-repellent films, hydrophilic films, conductive films, insulating films, semiconductor films, structure-reinforcing films, sacrificial films, and coating films.

Of these functional films, water-repellent films and oil-repellent films may be used on perforated substrates for applications where no liquid is used since such films would make it difficult to fill through-holes and channels with liquid.

The functional film may be formed on a portion of the first surface, a portion of the sidewalls of all through-holes, and portions of the second surface so that the desired effect can be achieved. For example, a protective film may be formed on a portion of the first surface, a portion of the sidewalls of all through-holes, and a portion of the second surface depending on the type of liquid used for the liquid ejection head and the required durability so that the portions susceptible to the liquid can be protected. The protective film may also be formed on a portion of the first surface, the entire sidewalls of all through-holes, and a portion of the second surface. The protective film and other layers forming the liquid ejection head may be used to form a structure in which the portions of the substrate and other components to be protected from the liquid do not directly contact the liquid, which results in improved durability.

The resist may be formed such that the resist closes all through-holes. In some cases, however, the resist need not close the through-holes at positions where the substrate does not contact the liquid when used as a liquid ejection head.

Examples of materials that may be used for the functional film include silicon and silicon compounds (compounds with one or more elements selected from oxygen, nitrogen, and carbon), metals, metal oxides, metal nitrides, metal carbides, and organic materials (e.g., polymers). Such materials include, for example, Si, SiO, SiN, SiC, SiON, SiCN, SiOC, SiOCN, Al, Au, Pt, Pd, Ti, Cr, Ta, Mo, Cu, Ni, Ir, W, stainless steel, metallic glasses, AlO, TiO, TaO, ZrO, LaO, CaO, HfO, SrO, VO, ZnO, InO, SnO, MgO, YO, GaN, InN, AlN, TiN, BN, diamond-like carbon (DLC), parylene, and mixtures and multilayer films thereof.

A functional film with uniform thickness can be formed over the entire substrate by processes such as thermal oxidation, sputtering, thermal deposition, vapor deposition polymerization, pulsed laser deposition (PLD), thermal chemical vapor deposition (CVD), plasma-enhanced CVD, catalytic (Cat) CVD, metal organic (MO) CVD, and atomic layer deposition (ALD). The functional film can also be formed by processes such as spin-on-glass (SOG) and the sol-gel process, in which a liquid material is applied to the substrate and is baked. The functional film can also be formed by plating.

In this example embodiment, one or both of steps a) and b) are performed. An example where step a) is performed will now be described with reference to FIGS. 3A to 3E. In step a), after the etching, it is determined whether there is a film patterning defect from a color change in the inspection member. FIGS. 3A to 3E illustrate an example method for manufacturing a liquid ejection head according to this example embodiment, showing cross-sections corresponding to a cross-section taken along line III-III of the liquid ejection head shown in FIG. 1.

Figure 3A:
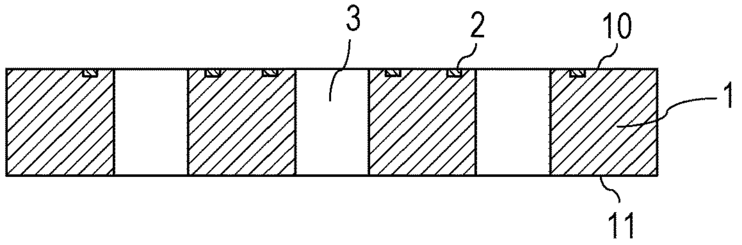
FIGS. 3A to 3E illustrate an example method for manufacturing a liquid ejection head according to an example embodiment.

As shown in FIG. 3A, energy-generating devices 2 that generate energy for liquid ejection are formed on a substrate 1 having a front surface 10 and a back surface 11, and through-holes 3 are formed in the substrate 1.

Figure 3B:
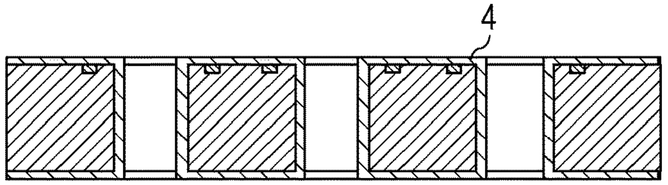

As shown in FIG. 3B, a functional film 4 is formed on the front surface 10, the back surface 11, and the sidewalls of the through-holes 3. The functional film 4 can be formed by known techniques.

Figure 3C:
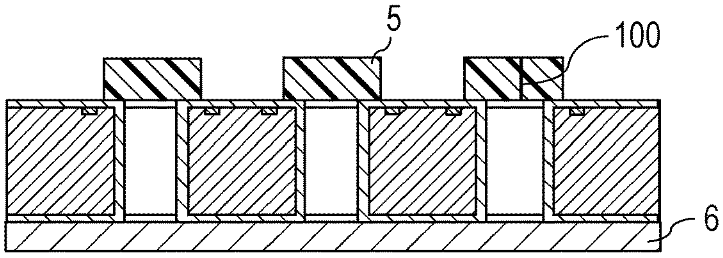

As shown in FIG. 3C, a resist 5 (a resist after patterning is shown) is formed on the front surface 10 of the substrate 1, and an inspection monitor 6 is formed on the back surface 11.

The resist 5 can be formed by spin coating, slit coating, spray coating, or nanoimprinting or using a dry film. The use of a dry film provides good thickness uniformity and flatness when the resist 5 is formed in the through-holes 3. Although the resist 5 is shown as not being present in the through-holes 3, the resist 5 may be present in the through-holes 3. This increases the adhesion area between the substrate 1 and the resist 5 and thus provides the advantage of increasing the adhesion strength between the substrate 1 and the resist 5. The resist 5 may be patterned by photolithography.

The inspection monitor 6 may be, for example, a member (e.g., a sheet or film) formed of a material such as glass, plastic, or resist, or an adhesive tape. The inspection monitor 6 may be used by bonding it to the back surface 11 of the substrate 1, optionally using an adhesive. The inspection monitor 6 may be formed of a material that transmits visible light so that the portions of the inspection monitor 6 that are located adjacent to the through-holes 3 can be observed from the opposite side.

The inspection monitor 6 may be an adhesive tape, which facilitates formation and removal of the inspection monitor 6. In particular, the inspection monitor 6 may be an adhesive tape that transmits visible light. Examples of adhesive tapes include UV-releasable adhesive tapes, thermally releasable adhesive tapes, and low-tack adhesive tapes. UV-releasable adhesive tapes and thermally releasable adhesive tapes may be used since these films are resistant to peeling during the process of manufacturing liquid ejection heads. Thermally releasable adhesive tapes, rather than UV-releasable adhesive tapes, may be used in a method for manufacturing liquid ejection heads using photolithography.

Examples of adhesive tapes that can be used include ICROS Tape (available from Mitsui Chemicals, Inc.), ELEP HOLDER (available from Nitto Denko Corporation), Semiconductor UV Tape (available from Furukawa Electric Co., Ltd.), Adwill (available from Lintec Corporation), ELEGRIP Tape (available from Denka Company Limited), SUMILITE (available from Sumitomo Bakelite Co., Ltd.), and ST Chuck Tape (available from Achilles Corporation) (all of which are trade names). Since there are various specifications for each tape, an adhesive tape may be selected depending on the specific manufacturing conditions for liquid ejection heads.

An inspection monitor with good alkali, acid, and heat resistance may be used since the inspection monitor 6 is present in photolithography and etching steps. Such an inspection monitor may be selected depending on the specific manufacturing conditions for liquid ejection heads.

Figure 3D:
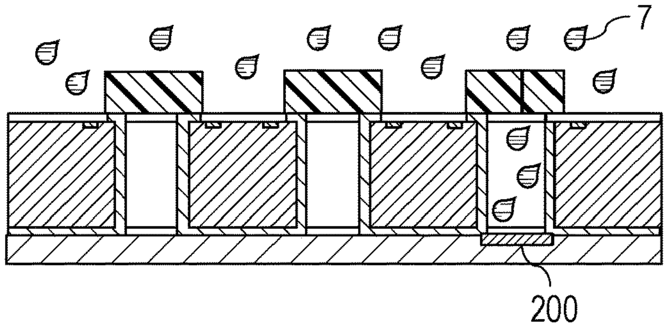

As shown in FIG. 3D, the functional film 4 on the front surface 10 is etched using the resist 5 as a mask. When a substance 7 used for the etching of the functional film 4 enters a through-hole 3 through a resist flaw 100, a portion affected by the substance 7 (flaw affected portion 200) appears, thus changing the appearance of the inspection monitor 6. Specifically, the substance 7 changes the color (lightness, saturation, or hue) of the inspection monitor 6. Thus, it can be determined whether there is a functional film patterning defect from a color change. Specifically, step a) is performed after the etching. This provides the advantage of facilitating detection of a functional film patterning defect. The substance 7 is a wet etchant, a cleaning liquid, or an etching gas. For wet etching, the entry of a wet etchant or a cleaning liquid, such as water, results in a difference in the appearance of the inspection monitor 6 between an area where there is a flaw and an area where there is no flaw. For dry etching, the entry of an etching gas results in a difference in the appearance of the inspection monitor 6 between an area where there is a flaw and an area where there is no flaw. The difference in the appearance of the inspection monitor 6 may result from etching damage to the inspection monitor 6 or from a residue of the components of the etchant or cleaning liquid or residual water. In either case, the appearance of the flaw affected portion 200 in the inspection monitor 6 facilitates detection of a defect that would be difficult to detect in the related art.

The inspection monitor 6 provides a significant advantage if the opening area of the through-holes 3 in the back surface 11 is larger than the opening area of the through-holes 3 in the front surface 10. The ratio of the opening area of the through-holes 3 in the back surface 11 to the opening area of the through-holes 3 in the front surface 10 is preferably twice or more, more preferably five times or more, even more preferably ten times or more. Although the through-holes 3 may have any larger opening area ratio (opening area of through-holes in back surface/opening area of through-holes in front surface) as long as no design problem arises, a larger ratio tends to result in a larger chip size. If the opening size of the through-holes 3 in the back surface 11 is assumed to be within $10^4$ times the length and width of the opening of the through-holes 3 in the front surface 10, the opening area ratio may be within $10^8$ times.

When the inspection monitor 6 is inspected for an influence that appears thereon, the above advantage can be more easily achieved as the maximum opening size of the through-holes 3 in the back surface 11 becomes larger. The preferred maximum size is 50 μm or more, more preferably 100 μm or more, even more preferably 1,000 μm or more. Although the through-holes 3 may have any larger maximum size as long as no design problem arises, an excessive maximum size is undesirable since the maximum size is associated with the chip size and the number of chips that can be arranged in each wafer. The maximum size may be 100 cm or less for large glass substrates. The maximum size of a rectangular opening is the length of the long sides thereof, whereas the maximum size of an elliptical opening is the length of the major axis thereof. The through-holes 3 need not have these opening shapes, but may have complicated shapes such as those composed of ellipses and curves with straight lines.

When a liquid such as a developer enters through a flawed portion and changes the appearance of the inspection monitor 6, the change in appearance may be easily identifiable if the liquid is colored. The resist, the developer (if the resist 5 is patterned with a developer), or the wet etchant (if the functional film 4 is wet-etched) may be colored. That is, the above advantage can be easily achieved if the resist, the developer, or the wet etchant absorbs light in the visible light region.

Examples of inspection techniques using the inspection monitor 6 include visual inspection, inspection under a microscope, inspection using an appearance tester equipped with a camera, and inspection based on light irradiation and reflection. A tester that can detect the color of the inspection monitor 6 can optionally be used.

If the resist 5 is patterned by photolithography, the inspection monitor 6 can be formed before the resist development step. The entry of the developer or cleaning liquid used in the development step through the resist flaw 100 into the through-hole 3 changes the appearance of the inspection monitor 6. In this case, the flaw 100 can be detected before wet etching, thus providing the advantage of allowing rework (forming the resist 5 again).

If photolithography is used, the inspection monitor 6 can be formed at any of the following timings: before resist formation, before resist prebaking, before resist exposure, before resist post-exposure baking (PEB), before resist development, before resist post-baking, and before etching.

If the resist is patterned by dry etching, two resist layers can be used, one for closing the through-holes 3 and the other for patterning. The inspection monitor 6 can be formed at any of the following timings: before the formation of the resist for closing the through-holes 3, before the prebaking of the resist for closing the through-holes 3, before the formation of the resist for patterning, before the prebaking of the resist for patterning, before resist exposure, before resist post-exposure baking (PEB), before resist development, before resist post-baking, and before dry etching.

FIGS. 3A to 3E and 4A to 4G illustrate examples of functional film patterning defects due to the resist flaw 100. However, flaws that cause functional film patterning defects include not only resist flaws such as scratches, cracks, holes, and patterning defects in the resist 5 itself, but also foreign substances and abnormal substrate shapes. Such flaws occur, for example, when the resist 5 is damaged by external physical force, when the resist 5 is formed, or when a region other than the desired region is exposed due to a flaw in the mask used for exposure. The disclosure is not limited to resist flaws, but is also effective for other flaws such as foreign substances and abnormal substrate shapes such as cracks and opening defects. For example, the situation that occurs when a foreign substance held between the resist 5 and the substrate 1 impedes the adhesion between the resist 5 and the substrate 1 is similar to the situation that occurs when the through-holes 3 are not successfully closed by the resist 5. If the foreign substance is debris deposited on the substrate 1, resist rework is performed. If the foreign substance adheres firmly to the substrate 1, rework is not performed. If the substrate 1 has an abnormal shape such as a widened opening due to a patterning defect, rework is not performed since the substrate 1 is defective irrespective of the condition of the resist 5. The cause of a defect that appears on the inspection monitor 6 can be identified by examining the defective chip, for example, under a microscope, and it can be determined whether rework is performed. Final defective chips are not used in the subsequent process.

Figure 3E:
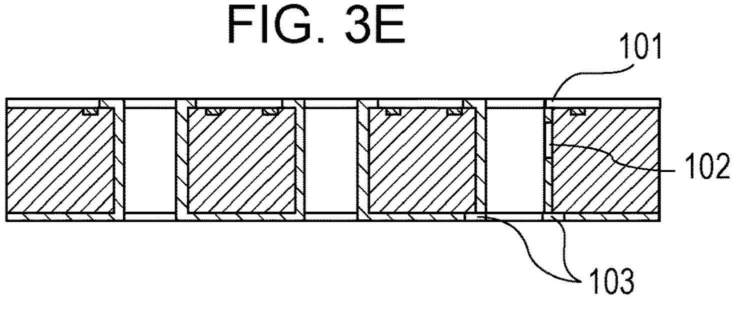

As shown in FIG. 3E, the resist 5 and the inspection monitor 6 can then be removed. FIG. 3E shows a situation where functional film patterning defects 101, 102, and 103 have occurred due to the resist flaw 100. Even if such functional film patterning defects have occurred, the inspection monitor 6 provides the advantage of preventing those defects from spreading to the adjacent chips. Specifically, as shown in FIGS. 3A to 3E, if a plurality of through-holes 3 are formed in a single substrate 1, the inspection monitor 6 can be used to close the openings of the through-holes 3 in the second surface so that defects that have occurred in one through-hole 3 do not spread to other through-holes 3.

In addition, a device to be brought into contact with the back surface 11 of the substrate 1, for example, during etching, can be brought into contact with the back surface 11 of the substrate 1 with the inspection monitor 6 therebetween, which provides the advantage of preventing the device from being contaminated with a substance such as an etchant from the back surface 11 of the substrate 1. The inspection monitor 6 also provides the advantage of preventing the device from leaving foreign substances and scratches on the substrate 1. Specifically, for example, there are cases where a certain device, such as a chuck device for holding the substrate 1, is brought into contact with the substrate 1. If the inspection monitor 6 is provided, the device can be brought into contact with the substrate 1 with the inspection monitor 6 therebetween, thereby preventing the device from being contaminated from the substrate 1 and from leaving foreign substances and scratches on the substrate 1. The inspection monitor 6 may also be configured to function as a support substrate for supporting the substrate 1.

After the removal of the inspection monitor 6, a channel-forming member is formed in a suitable manner, and optionally, a backside functional member is formed. The substrate 1 is then cut into chips to obtain liquid ejection heads.

An example where step b) is performed will now be described with reference to FIGS. 4A to 4G. The inspection member used in step b) is a deformable member. It is determined whether there is a flaw that causes a film patterning defect from a height difference that appears on the inspection member at a pressure (P2) different from the pressure (P1) at which the openings of the through-holes in the first and second surfaces are closed.

If the openings of the through-holes in the first surface are closed by the resist before the openings of the through-holes in the second surface are closed by the inspection monitor, the pressure P1 is the pressure (pressure inside the through-holes) at which the openings of the through-holes in the second surface are closed. If the openings of the through-holes in the second surface are closed before the openings of the through-holes in the first surface are closed, the pressure P1 is the pressure (pressure inside the through-holes) at which the openings of the through-holes in the first surface are closed.

As described in detail later, when the substrate is placed under the pressure P2 different from the pressure P1, with the openings of the through-holes in the first and second surfaces being closed, the difference between the pressures P1 and P2 causes the portions of the inspection member corresponding to the through-holes to be depressed or raised (i.e., become concave or convex) if the through-holes are successfully sealed. If the through-holes are not successfully sealed, there is less or no pressure difference, and accordingly, the portions of the inspection member corresponding to the through-holes become less concave or convex (or do not become concave or convex). It can thus be determined whether there is a flaw. The pressure P1 may be, but not limited to, a negative pressure, whereas the pressure P2 may be, but not limited to, the atmospheric pressure.

Figure 4A:
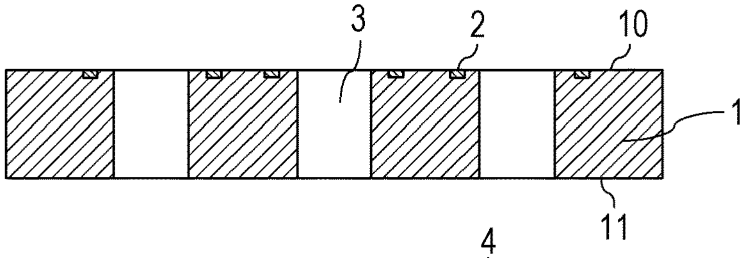
FIGS. 4A to 4G illustrate another example method for manufacturing a liquid ejection head according to the example embodiment.
Figure 4B:
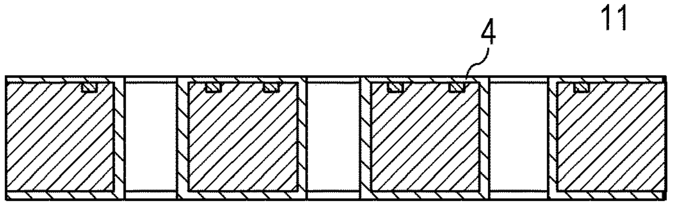

FIGS. 4A to 4G illustrate another example method for manufacturing a liquid ejection head according to this example embodiment, showing cross-sections corresponding to a cross-section taken along line IV-IV of the liquid ejection head shown in FIG. 1. FIGS. 4A and 4B are similar to FIGS. 3A and 3B, respectively. The inspection monitor used in this example is a deformable member. The inspection monitor may be any member that is deformable (into a concave or convex shape) by the difference between the pressures P1 and P2 in the environment where it is determined whether there is a flaw in step b).

Figure 4C:
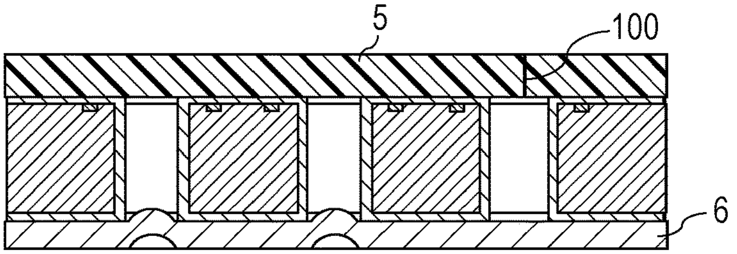

As shown in FIG. 4C, a reduced pressure is created in the through-holes 3 closed by the resist 5 and the flexible inspection monitor 6. This results in a pressure difference between the through-hole 3 where there is the resist flaw 100 and the through-holes 3 where there is no resist flaw, and concavities appear on the inspection monitor 6. Specifically, a reduced pressure is maintained in the closed spaces formed in the through-holes 3 when the openings are closed by the resist 5 and the inspection monitor 6, and the substrate 1 is placed under a higher pressure (typically, under the atmospheric pressure). As a result, the portions of the inspection monitor 6 that close the through-holes 3 where there is no flaw become concave, whereas the portions of the inspection monitor 6 that close the through-holes 3 where there is a flaw do not become concave or become less concave since outside air enters the through-holes 3. This height difference (the difference in the degree of deformation) can be detected and used to determine whether there is a flaw that causes a film patterning defect. Thus, the flaw determination in step b) can be performed at this stage (using a deformable member as the inspection monitor 6). This allows functional film patterning defects to be prevented.

The inspection monitor 6 can also be formed under increased pressure so that the inspection monitor 6 becomes convex. However, the inspection monitor 6 may be configured to become concave for ease of manufacture since the presence of convexities on the back surface 11 of the substrate 1 may impede transportation and suction during the manufacture of liquid ejection heads.

An appropriate period of time from the creation of a reduced pressure to inspection using the inspection monitor 6 may be selected to ensure a significant pressure difference.

This method provides the advantage of allowing rework since a flaw can be detected without etching even if the inspection monitor 6 is formed immediately before etching. This method also provides the advantage of allowing greater flexibility in the choice of the material for the inspection monitor 6 since a member that does not transmit light can be used as the inspection monitor 6.

If the inspection monitor 6 is formed before the through-holes 3 are closed, the resist 5 may be formed under reduced pressure. For example, the resist 5 may be formed under reduced pressure by laminating a dry film resist under reduced pressure. Rework may be performed by removing the inspection monitor 6 and forming the resist 5 again.

However, the inspection monitor 6 may be formed under reduced pressure after resist exposure and before etching since concavities or convexities appearing on the inspection monitor 6 may affect the accuracy of resist exposure.

The inspection monitor 6 may have a higher flexibility so that the inspection monitor 6 becomes more concave. Accordingly, the inspection monitor 6 may be a flexible adhesive tape including an adhesive layer and a step-covering layer. The adhesive layer has an adhesion function. The step-covering layer is more flexible than the substrate. Alternatively, a flexible adhesive layer may be used so that the adhesive layer also functions as a step-covering layer. However, an extremely high flexibility tends to result in the formation of concavities or convexities that are difficult to identify on the inspection monitor 6. Thus, the adhesive layer and the step-covering layer preferably have a total thickness of 20 to 1,000 μm, more preferably 50 to 500 μm. The adhesive layer and the step-covering layer may be formed of materials such as acrylic resins, silicone resins, polyolefins, and rubbers.

Examples of materials that can be used for the substrate of the adhesive tape include plastics such as polyethylene terephthalate (PET), polyethylene naphthalate (PEN), polyvinyl chloride (PVC), polypropylene (PP), polycarbonate (PC), polyethylene (PE), polyurethane (PU), polyimide (PI), and polyvinyl alcohol (PVA). The substrate may be thinner as long as the substrate does not fracture under the conditions of use. The preferred thickness is 1,000 μm or less, more preferably 500 μm or less, even more preferably 100 μm or less.

A higher degree of vacuum causes the inspection monitor 6 to become more concave or convex. The preferred degree of vacuum is 1,000 Pa or less, more preferably 500 Pa or less, even more preferably 200 Pa or less. Although a degree of vacuum of up to about $10^{-8}$ Pa is generally technically feasible, the degree of vacuum may be selected depending on productivity and cost.

The strength and viscoelastic properties of the resist 5 can be controlled by changing the material and thickness of the resist 5 and the baking conditions. This control prevents a flaw from occurring in the resist 5 when a vacuum is created.

A larger difference between the reduced pressure and the pressure during inspection causes the inspection monitor 6 to become more concave or convex. Although inspection may be performed under increased or reduced pressure, inspection in an environment under the atmospheric pressure is advantageous in terms of inspection cost and takt time since it eliminates the need for a special system and the time for increasing or reducing the pressure.

For example, if the inspection monitor 6 is formed at a temperature higher than the softening temperature of the resist 5 and is used for inspection, the resist 5 may become concave, and accordingly the inspection monitor 6 may become less concave. In this case, the temperature at which the inspection monitor 6 is formed may be decreased, or the baking temperature of the resist 5 may be controlled to increase the softening temperature of the resist 5, so that the inspection monitor 6 is softer than the resist 5 during inspection.

The inspection monitor 6 may be inspected for concavities or convexities by techniques other than those described above, i.e., visual inspection, microscopy, and appearance inspection using a camera. Specifically, instruments such as contact surface profilers, scanning probe microscopes, scanning electron microscopes, laser microscopes, three-dimensional measurement instruments based on light interference, and measurement instruments based on fringe patterns and phase differences can be used. For simple inspection, visual inspection, microscopy, or appearance inspection using a camera may be used.

Figure 4D:
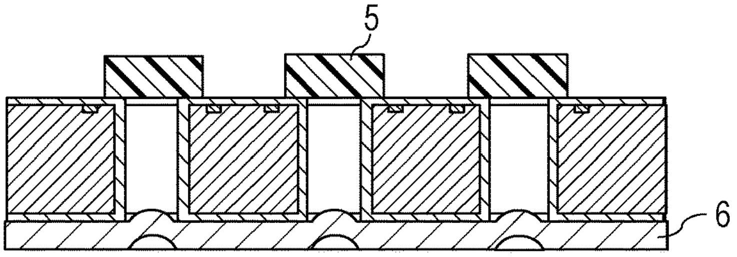

As shown in FIG. 4D, if a flaw is found, rework can be performed by stripping the inspection monitor 6 and the resist 5 and forming the resist 5 again. Rework may be skipped if there are only a tolerable number of flaws. If rework is performed, the inspection monitor 6 may also be formed again, and flaw detection may be performed again. FIG. 4D illustrates an example where no defect has been detected after rework.

Figure 4E:
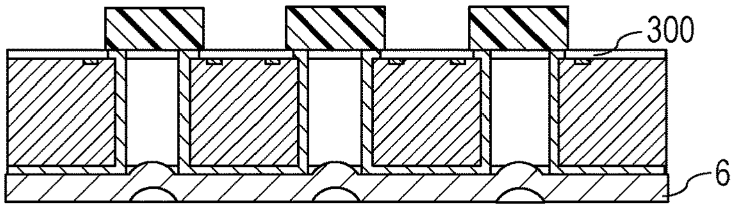

As shown in FIG. 4E, the functional film 4 is etched to form regions 300 where the functional film 4 has been removed. If a flaw has been found before this step, the material used in any step can remain in the through-holes 3. Accordingly, a drying step using baking or reduced pressure or a cleaning step, or both, may be added to evaporate, remove, or solidify any residue, which provides the advantage of reducing its influence on the manufacturing apparatus. The cleaning step may be performed after the stripping of the inspection monitor 6, which provides the advantage of facilitating removal of any residue.

Figure 4F:
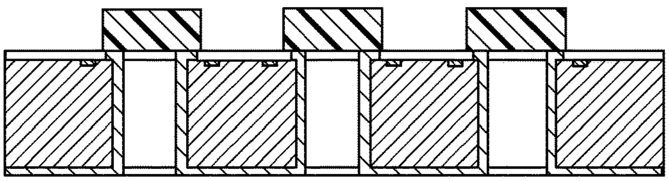

As shown in FIG. 4F, the inspection monitor 6 is then stripped. Although the stripping of the inspection monitor 6 need not be performed at this timing, the stripping of the inspection monitor 6 before the stripping of the resist 5 improves the ease of liquid substitution in the through-holes 3, which provides the advantage of facilitating stripping of the resist 5.

The removal of the inspection monitor 6 from the substrate 1 may leave a residue from the inspection monitor 6 on the substrate 1, and a cleaning step may be required to remove the residue. If the residue is soluble in the resist stripping solution, the stripping of the resist 5 and the removal of the residue can be simultaneously performed, which provides the advantage of reducing the number of cleaning steps. Alternatively, the inspection monitor 6 itself may be a member that is soluble in the resist stripping solution so that the resist 5 and the inspection monitor 6 can be simultaneously stripped. Thus, at least a portion of the inspection monitor 6 may be soluble in the resist stripping solution.

Figure 4G:
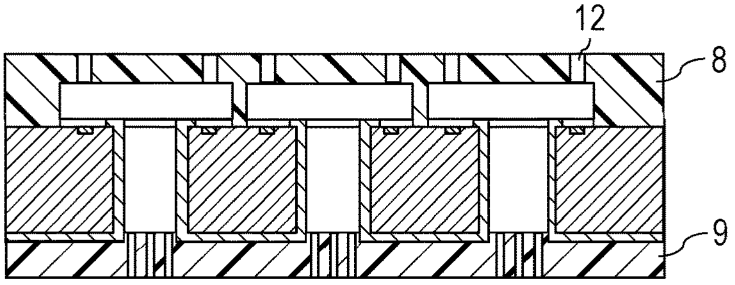

As shown in FIG. 4G, the channel-forming member 8 can be formed on the front surface 10 by a known technique. Optionally, a backside functional member 9 that functions as, for example, a debris filter can also be formed. The substrate 1 is then cut into chips to obtain liquid ejection heads.

At some manufacturing sites, sampling inspection is performed since 100% inspection results in a time loss. Sampling inspection provides the advantage of allowing efficient inspection.

The method according to this example embodiment is applicable not only to the manufacture of liquid ejection heads, but also to the fabrication of perforated substrates, including the fabrication of vias and the fabrication of functional films in through-holes of printed boards. In addition, it is not necessary to use functional films, but any etchable film can be used.

Example

The present disclosure is further illustrated by the following example, although this example is not intended to limit the scope of the disclosure.

As shown in FIG. 4A, TaSiN energy-generating devices 2 were formed on a single-crystal silicon substrate 1, and through-holes 3 were formed in the substrate 1 by dry etching.

As shown in FIG. 4B, a SiO functional film 4 with a thickness of 100 nm was formed by ALD on the front surface 10, the back surface 11, and the sidewalls of the through-holes 3 of the substrate 1.

As shown in FIG. 4C, a dry film resist 5 (the trade name PMER, available from Tokyo Ohka Kogyo Co., Ltd.) with a thickness of 20 μm was then transferred to the front surface 10 of the substrate 1. The resist 5 was prebaked at 150° C. for 10 minutes, was exposed with a stepper (the trade name FPA-5510iV, available from CANON KABUSHIKI KAISHA), and was subjected to PEB.

Five seconds after the set value of the vacuum system, i.e., 100 Pa or less, was reached, a thermally releasable adhesive tape (ICROS Tape (trade name), available from Mitsui Chemicals, Inc.), serving as the inspection monitor 6, was stuck to the back surface 11 of the substrate 1 under the reduced pressure to close the openings of the through-holes 3 in the back surface 11. The inspection monitor 6 was then visually inspected under the atmospheric pressure. Although the inspection monitor 6 did not become concave at some positions, the inspection monitor 6 became concave at most of the through-holes 3. Although some flaws that cause functional film patterning defects were found on the substrate 1 in step b), rework was skipped since there were only a limited number of flaws, and the process proceeded to the next step.

As shown in FIG. 4D, development was then performed with an aqueous tetramethylammonium hydroxide (TMAH) solution. The resist 5 was patterned such that the resist 5 closed the openings of the through-holes 3 in the front surface 10. Although the developer entered through the flawed portions on the front surface 10, the adhesive tape prevented the developer from reaching the region where the substrate 1 was chucked, thus preventing apparatus contamination.

As shown in FIG. 4E, the functional film 4 was then etched with buffered hydrofluoric acid only on the front surface 10. Although the etchant entered through the flawed portions on the front surface 10, the adhesive tape prevented contamination on the back surface 11.

As shown in FIG. 4F, the inspection monitor 6 was then stripped. Thereafter, the resist 5 was stripped.

As shown in FIG. 4G, a channel-forming member 8 was formed using an epoxy-based photosensitive resin, and a backside functional member 9 was formed using the same material. The substrate 1 was then cut into chips to obtain liquid ejection heads.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-229323, filed Nov. 25, 2016, which is hereby incorporated by reference herein in its entirety.

What is claimed is:

1. A method for manufacturing a perforated substrate, comprising:

forming at least one through-hole extending through a substrate from a first surface to a second surface opposite the first surface;

forming a film on the first surface, a sidewall of the at least one through-hole, and the second surface;

forming a resist on the first surface;

patterning the resist such that the resist closes an opening of the at least one through-hole in the first surface;

etching the film on the first surface using the resist as a mask;

before the etching step, forming an inspection member on the second surface such that the inspection member closes an opening of the at least one through-hole in the second surface; and at least one of the steps of:

a) after the etching, determining whether there is a flaw that causes a film patterning defect from a color change in the inspection member, the color change located at the closed opening of the at least one through-hole in the second surface, wherein the inspection member is an adhesive tape that transmits visible light; and b) determining whether there is a flaw that causes a film patterning defect from a deformation that appears in the inspection member at an atmospheric pressure, the deformation located at the closed opening of the at least one through-hole in the second surface, wherein the openings of the at least one through-hole in the first and second surfaces are closed at a reduced pressure of 1,000 Pa or less, and the inspection member is a deformable adhesive tape comprising an adhesive layer and a step-covering layer, the adhesive layer and the step-covering layer having a total thickness of 20 to 1,000 μm.

2. The method for manufacturing a perforated substrate according to claim 1, wherein the opening of the at least one through-hole in the second surface has a maximum size of 50 μm or more.

3. The method for manufacturing a perforated substrate according to claim 2, wherein the method comprises step a), and at least one of the resist, a developer used for the patterning, and a wet etchant used for the etching absorbs light in a visible light region.

4. The method for manufacturing a perforated substrate according to claim 3, further comprising stripping the resist after the etching, wherein a resist stripping solution used in the stripping step dissolves at least a portion of the inspection member.

5. The method for manufacturing a perforated substrate according to claim 2, wherein the method comprises step a), and the resist is formed using a dry film and is patterned by photolithography.

6. The method for manufacturing a perforated substrate according to claim 2, wherein the at least one through-hole formed in the substrate comprises a plurality of through-holes, and the inspection member closes the openings of the plurality of through-holes in the second surface.

7. The method for manufacturing a perforated substrate according to claim 2, further comprising bringing a device to be brought into contact with the substrate into contact with the substrate with the inspection member between the substrate and the device.

8. The method for manufacturing a perforated substrate according to claim 2, further comprising stripping the resist after the etching, wherein a resist stripping solution used in the stripping step dissolves at least a portion of the inspection member.

9. The method for manufacturing a perforated substrate according to claim 1, wherein the method comprises step a), and at least one of the resist, a developer used for the patterning, and a wet etchant used for the etching absorbs light in a visible light region.

10. The method for manufacturing a perforated substrate according to claim 9, further comprising stripping the resist after the etching, wherein a resist stripping solution used in the stripping step dissolves at least a portion of the inspection member.

11. The method for manufacturing a perforated substrate according to claim 1, wherein the method comprises step a), and the resist is formed using a dry film and is patterned by photolithography.

12. The method for manufacturing a perforated substrate according to claim 1, wherein the at least one through-hole formed in the substrate comprises a plurality of through-holes, and the inspection member closes the openings of the plurality of through-holes in the second surface.

13. The method for manufacturing a perforated substrate according to claim 1, further comprising bringing a device to be brought into contact with the substrate into contact with the substrate with the inspection member between the substrate and the device.

14. The method for manufacturing a perforated substrate according to claim 1, further comprising stripping the resist after the etching, wherein a resist stripping solution used in the stripping step dissolves at least a portion of the inspection member.

15. A method for manufacturing a liquid ejection head comprising a substrate having an energy-generating device on a first surface and a channel-forming member having an orifice and forming a liquid channel with the first surface of the substrate, the substrate having a through-hole extending through the substrate and communicating with the liquid channel, the through-hole serving as a supply hole through which a liquid is supplied from a second surface opposite the first surface of the substrate to the liquid channel, the method comprising:

forming at least one through-hole extending through a substrate from a first surface to a second surface;

forming a film on the first surface, a sidewall of the at least one through-hole, and the second surface;

forming a resist on the first surface;

patterning the resist such that the resist closes an opening of the at least one through-hole in the first surface;

etching the film on the first surface using the resist as a mask;

before the etching, forming an inspection member on the second surface such that the inspection member closes an opening of the at least one through-hole in the second surface; and at least one of the steps of:

a) after the etching, determining whether there is a flaw that causes a film patterning defect from a color change in the inspection member, the color change located at the closed opening of the at least one through-hole in the second surface, wherein the inspection member is an adhesive tape that transmits visible light; and b) determining whether there is a flaw that causes a film patterning defect from a deformation that appears in the inspection member at an atmospheric pressure, the deformation located at the closed opening of the at least one through-hole in the second surface, wherein the openings of the at least one through-hole in the first and second surfaces are closed at a reduced pressure of 1,000 Pa or less, and the inspection member is a deformable adhesive tape comprising an adhesive layer and a step-covering layer, the adhesive layer and the step-covering layer having a total thickness of 20 to 1,000 μm.

16. A method for detecting a film patterning defect or a flaw that causes a film patterning defect on a substrate having at least one through-hole and having a film on a first surface, a second surface opposite the first surface, and a sidewall of the at least one through-hole when the film on the first surface is patterned by etching using a resist as a mask, the resist being patterned on the first surface such that the resist closes an opening of the at least one through-hole in the first surface, the method comprising:

before the etching, forming an inspection member on the second surface such that the inspection member closes an opening of the at least one through-hole in the second surface; and at least one of the steps of:

a) after the etching, determining whether there is a flaw that causes a film patterning defect from a color change in the inspection member, the color change located at the closed opening of the at least one through-hole in the second surface, wherein the inspection member is an adhesive tape that transmits visible light; and b) determining whether there is a flaw that causes a film patterning defect from a deformation that appears on the inspection member at an atmospheric pressure, the deformation located at the closed opening of the at least one through-hole in the second surface, wherein the openings of the at least one through-hole in the first and second surfaces are closed at a reduced pressure of 1,000 Pa or less, and the inspection member is a deformable adhesive tape comprising an adhesive layer and a step-covering layer, the adhesive layer and the step-covering layer having a total thickness of 20 to 1,000 μm.

* * * * *